May 14, 1968 J. F. NOVAK 3,383,613
OUTPUT TRANSFORMERLESS PUSH-PULL FULL BRIDGE POWER AMPLIFIER HAVING FLOATING POWER SUPPLY
Filed April 11, 1966
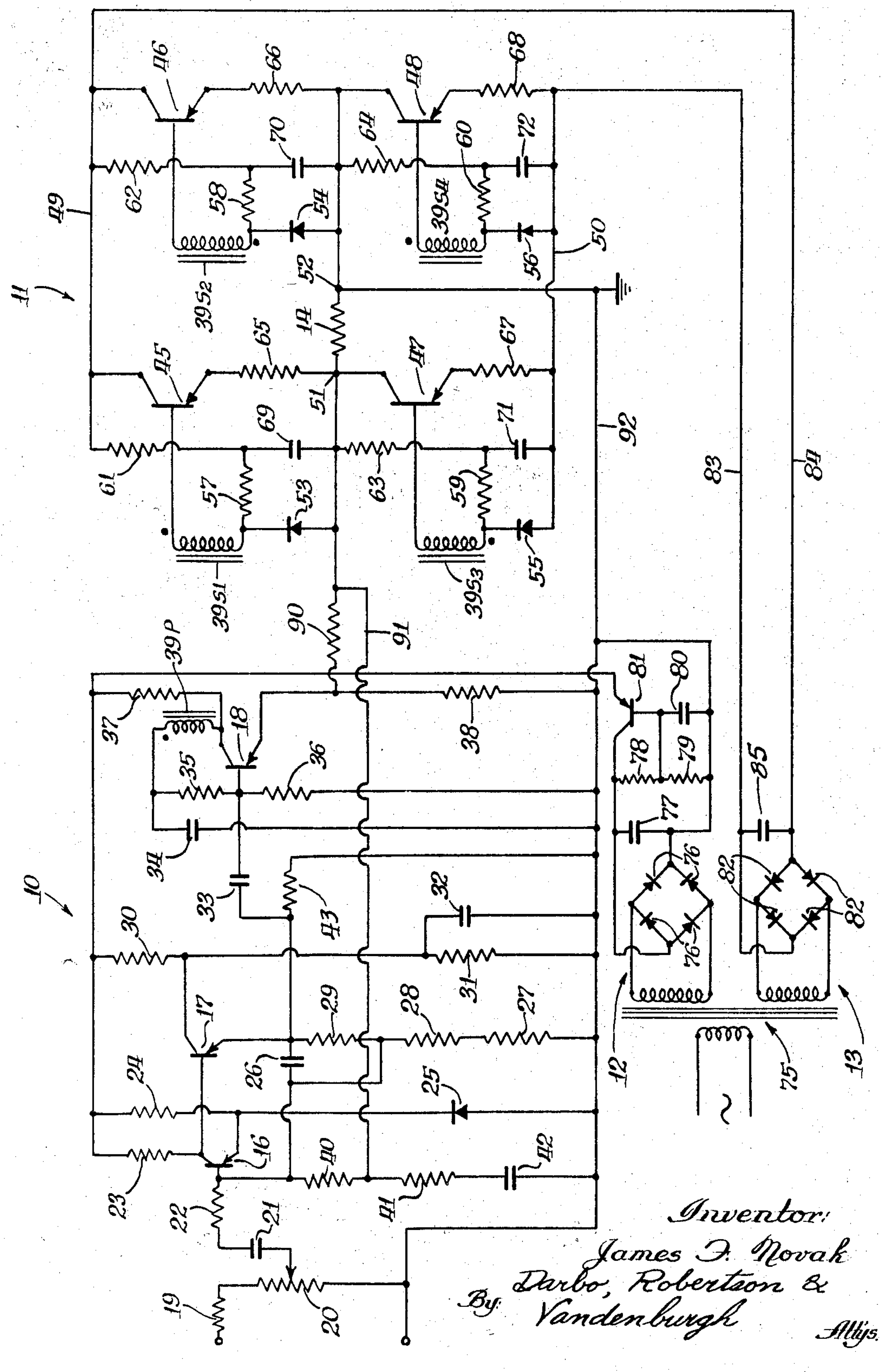
Inventor:
James F. Novak
By Darbo, Robertson & Vandenburgh
Attys.

United States Patent Office 3,383,613

Patented May 14, 1968

3,383,613

OUTPUT TRANSFORMERLESS PUSH-PULL FULL BRIDGE POWER AMPLIFIER HAVING FLOATING POWER SUPPLY

James F. Novak, La Grange Park, Ill., assignor to The Muter Company, Chicago, Ill., a corporation of Illinois Filed Apr. 11, 1966, Ser. No. 541,798

3 Claims. (Cl. 330—22)

The present invention relates to improvements in amplifiers such as those for audio reproduction and incorporates a full bridge power amplifier with feedback to the driver amplifier without the necessity of electrically isolating the two amplifiers through the feedback circuit, and the following disclosure thereof is offered for public dissemination upon the grant of a patent therefor.

In audio reproduction systems, particularly those intended for the so-called "high fidelity" installation, it is often desired to have peak power output capabilities of the amplifier in the range of one hundred watts or higher. The usual such power amplifier in use today utilizes a half-bridge push-pull circuit. With such a configuration it is necessary that the power supply voltage capabilities be twice that of the desired output of the amplifier. That is, for example, in an output transformerless half-bridge power amplifier, the peak A.F. voltage appearing across the load at maximum power must be $E_p=V_{cc}=2\sqrt{PR_L}$ where $V_{cc}$ is the power supply D.C. voltage, P the power output and $R_L$ the load resistance. By way of comparison, if the amplifier used a full-bridge design, the peak A.F. voltage across the load at the same power level would be $E_p=V_{cc}=\sqrt{PR_L}$. This clearly shows that $V_{cc}$, the D.C. output voltage from the power supply, must (in the case of the half-bridge) be twice the voltage required for the full-bridge amplifier. The power supply components and output stage components and particularly the output transistors must, therefore, be capable of withstanding twice the peak inverse voltage that is really required for delivering a given amount of power into the load.

The net result is that a substantially more expensive transistor must be employed in the power amplifier than is necessary merely to handle the power output of the particular transistor. In comparing the cost of two transistors whose characteristics are otherwise approximately the same, but wherein one will withstand twice the peak inverse voltage of the other, that one may cost up to ten times as much as will the other. This can be a substantial factor in the origial, and maintenance, cost of an amplifier. Also it is of course obvious that there will be added cost to a power supply if it is necessary to produce twice the voltage at the same current drain.

The foregoing cost problems are greatly ameliorated by the use of a full-bridge circuit. The power supply requirements are greatly reduced since with a full-bridge circuit the voltage utilized in driving the load is twice that of the power supply. The cost of the transistor for the power amplifier is greatly reduced since their inverse voltage characteristics need only be half as high as is the case with the transistors in a half-bridge amplifier.

Full-bridge amplifiers were known prior to the present invention. However, they have not been generally employed in audio amplifiers of the type discussed because of the difficulty in providing feedback from the power amplifier to the driver amplifier. In the known full-bridge circuits, as is the case with amplifiers generally, one side of the power supply is grounded. With this configuration it is necessary to electrically insulate the power amplifier from the driver amplifier in the feedback circuit. This electrical insulation ordinarily consists of an output transformer. The use of such an indutcance coupling adds to the complexity and cost of the amplifier.

The present invention provides a ful-bridge power amplifier, with its attendant advantages, while permitting any of the conventional feedback couplings without the necessity of electrically isolating the power amplifier and the driver amplifier in the feedback circuit. This is done by providings a separate power supply for the power amplifier, which power supply is floating with respect to ground. The term "floating" is employed in the sense that neither of the two power supply leads is grounded.

While at first blush it might appear that there was added cost in the necessity for two power supplies, this is much more than offset by the reduction in cost of the transistors in the power amplifier. For example, in one embodiment of the present invention the four transistors of the power amplifier cost about one-fifth as much as would two transistors for a half-bridge power amplifier having the same performance characteristics. Furthermore, the cost of two power supplies is not double that of the cost of a single power supply (used alone for both the driver amplifier and a half-bridge power amplifier) because simplifications can be effected in the power supplies for the two amplifiers as a result of the requirements peculiar to each.

Further objects and advantages of the present invention will be apparent from the following description taken in conjunction with the drawing which is a schematic illustration of an embodiment of the invention.

Although the following disclosure offered for public dissemination is detailed to ensure adequacy and aid understanding, this is not intended to prejudice that purpose of a patent which is to cover each new inventive concept therein no matter how others may later disguise it by variations in form or additions or further improvements. The claims at the end hereof are intended as the chief aid toward this purpose; as it is these that meet the requirement of pointing out the parts, improvements, or combinations in which the inventive concepts are found.

In the illustrated embodiment there is a driver amplifier generally 10, a power amplifier generally 11, a power supply generally 12 for the driver amplifier and a power supply generally 13 for the power amplifier. Considered individually, each one of these items is comparatively straight forward and conventional. However, the invention resides in the manner in which they are integrated or interrelated, the fact that the power supply 13 is ungrounded and the fact that the feedback from the power amplifier to the driver may be selected from any of the well-known types and is not restricted to an electrically isolating feedback. Power amplifier 11 drives a load 14, such as, for example, an 8-ohm loudspeaker.

*Driver amplifier*

The driver amplifier includes three transistors, 16, 17, and 18; the first two of these are 2N1307 transistors and the third is a 2N2148 transistor. Input resistor 19 is 4.7K. ohms. Volume control 20 is 25K. ohms. Capacitor 21 and resistor 22 are 150 microfarads and 2200 ohms, respectively. Resistors 23 and 24 are 3.9K. ohms and 22K. ohms, respectively. Diode 25 is a 1N2069. Capacitor 26 is 250 picofarads. Resistors 27, 28 and 29 are, respectively, 100 ohms, 5.6K. ohms and 33K. ohms. Resistor 30 is 820 ohms. Resistor 31 is 1,000 ohms. Capacitor 32 is 150 microfarads. Capacitors 33 and 34 are 150 microfarads and 350 microfarads, respectively. Resistors 35, 36, 37, and 38 are, respectively, 5.6K. ohms, 180 ohms, 560 ohms, and 5.6 ohms. For coupling, 39P is the primary of a coupling transformer having four secondaries—39S1, 39S2, 39S3 and 39S4—respectively. The dots on the drawing in conjunction with each of these windings indicates the corresponding ends of the windings. Resistors 40 and 41 are 243K. ohms and 33 ohms, respectively. Capacitor 42 is 0.02 microfarads. Resistor 43 is 470 ohms.

The term "driver amplifier" as used herein is employed to refer to such stages as may precede the power stage. That is, in some embodiments there might only be one stage preceding the power stage and in some (as in the disclosed embodiment) there might be several stages before the power amplifier. The feedback from the power amplifier to the driver amplifier might be through some of these earlier stages. If a "preamplifier" is employed this could be considered to be a part of the driver amplifier and not necessarily a separate amplifier.

*Power amplifier*

The power amplifier comprises four transistors, 45, 46, 47 and 48, each of which is in one arm of a full-bridge. That is, wire 49 represents one corner of the bridge; wire 50 represents a second corner of the bridge and output connections 51 and 52 represent the other two corners of the bridge. It will be apparent from the drawing that output connection 52 is grounded.

The four diodes 53, 54, 55, and 56 are each a 1N2326. Resistors 57, 58, 59, and 60 are each 120 ohms. Resistors 61, 62, 63, and 64 are each 180 ohms. Resistors 65, 66, 67, and 68 are each 0.27 ohms. Capacitors 69, 70, 71, and 72 are each 100 microfarads.

*Power supplies*

Transformer 75 has a common primary and two secondaries, one for each of the two individual power supplies. The power supply generally 12 for the driver amplifier includes four MR323 diodes to which the number 76 has been applied. These four are connected together as a full bridge. The filter includes a 4500 microfarad capacitor 77, resistors 78 and 79 of 560 and 44K. ohms, respectively, a 500 microfarad capacitor 80, and a 2N319 transistor 81. The bridge rectifier of power supply 13 is formed by four 1N2860 diodes 82, and a 4500 microfarad filtering capacitor 85. It will be noted that power supply 13 is floating with respect to ground since neither of the power leads 83 or 84 is grounded.

*Feedback*

In the illustrated embodiment there are two feedback loops from the power amplifier to the driver amplifier. The first of these is by way of resistor 90 from the power amplifier signal output, as represented by connection 51, to the emitter of transistor 18; the other is from the same point in the power amplifier to the base of transistor 16 by way of wire 91 to the voltage divider formed by resistors 40 and 41. Of course, the second side of both of these feedback circuits is formed by the ground connection as represented by wire 92.

I claim:

1. In an amplifying apparatus comprising a driver amplifier, a power supply for said driver amplifier and a power amplifier, the improvement comprising: said power amplifier being a full-bridge amplifier; feedback means forming a direct electrical connection between said power amplifier and the driver amplifier for supplying a feedback signal from the power amplifier to the driver amplifier, said feedback means having a grounded portion; and an additional, separate, power supply for supplying power to the power amplifier, the later power supply floating with respect to ground.

2. In an audio amplifying apparatus for driving a load which will produce an audible sound, wherein the apparatus includes a driver amplifier, a power supply for the driver amplifier and having a common ground with the driver amplifier and a power amplifier connected to the driver amplifier to receive signals therefrom and having output connections to which the load is connected with one of those output connections being connected to the common ground, the improvement comprising: said power amplifier comprising four transistors connected as a full-bridge having four arms and junctions therebetween with a transistor in each arm of the bridge, two of said junctions being common with the output connections, impedance means forming, with said common ground, a feedback circuit connected to the ungrounded output connection and the driver amplifier; power supply means for the power amplifier and connected to the other two junctions, said two connections being ungrounded whereby said impedance means may form a direct electrical connection between the power amplifier and the driver amplifier.

3. In an apparatus as set forth in claim 2, wherein the connection of the power amplifier to the driver amplifier to receive signals therefrom includes transformer coupling means.

References Cited

UNITED STATES PATENTS

| | | | |
|---|---|---|---|
| 3,015,695 | 1/1962 | Claras et al. ------ | 330—200 X |
| 3,102,984 | 9/1963 | Locanthi ---------- | 330—22 X |

JOHN KOMINSKI, *Primary Examiner.*

J. B. MULLINS, *Assistant Examiner.*